United States Patent
Zhang et al.

(10) Patent No.: US 9,065,406 B2
(45) Date of Patent: Jun. 23, 2015

(54) CONTINUOUS VARIABLE GAIN AMPLIFIER

(71) Applicant: Huawei Technologies Co., Ltd., Shenzhen, Guangdong (CN)

(72) Inventors: Zhi Zhang, Shanghai (CN); Xinrong Hu, Shanghai (CN); Jin Rao, Shanghai (CN); Yongli Wang, Shanghai (CN); Xiaosheng Zhu, Shanghai (CN); Rong Peng, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 26 days.

(21) Appl. No.: 14/141,128

(22) Filed: Dec. 26, 2013

(65) Prior Publication Data

US 2014/0191803 A1 Jul. 10, 2014

(30) Foreign Application Priority Data

Jan. 5, 2013 (CN) .......................... 2013 1 0002285

(51) Int. Cl.
*H03F 3/45* (2006.01)
*H03G 1/00* (2006.01)
*H03G 3/30* (2006.01)

(52) U.S. Cl.
CPC ........... *H03G 1/0023* (2013.01); *H03G 3/3036* (2013.01)

(58) Field of Classification Search
USPC .................. 330/254, 284, 124 R, 295, 53
IPC .......................................................... H03F 3/45
See application file for complete search history.

(56) References Cited

U.S. PATENT DOCUMENTS

| 7,990,217 | B2 | 8/2011 | Gilbert et al. | |
| 8,058,926 | B2 * | 11/2011 | Saman et al. | 327/560 |
| 8,531,241 | B1 * | 9/2013 | Cohen | 330/253 |
| 2002/0175758 | A1 * | 11/2002 | Cyrusian et al. | 330/254 |
| 2007/0216482 | A1 * | 9/2007 | Hollenbeck et al. | 330/254 |
| 2012/0242408 | A1 * | 9/2012 | Huang et al. | 330/254 |

OTHER PUBLICATIONS

Meyer et al., "A DC to 1-GHz Differential Monolithic Variable-Gain Amplifier," IEEE Journal of Solid-State Circuits, pp. 1673-1680, vol. 26, No. 11, Institute of Electrical and Electronics Engineers, New York, New York (Nov. 1991).

Elwan et al., "A 49-dB continuous Linear-in-dB If VGA Technique," IEEE International Symposium on Circuits and Systems, pp. 2962-2965, Taipei, Institute of Electrical and Electronics Engineers, New York, New York (May 24-27, 2009).

* cited by examiner

*Primary Examiner* — Patricia T Nguyen
(74) *Attorney, Agent, or Firm* — Leydig, Voit & Mayer, Ltd.

(57) ABSTRACT

A continuous variable gain amplifier includes an attenuator network, a boost network, a first amplifying network, and a second amplifying network, where the attenuator network generates first differential output signals according to an input signal and sends the first differential output signals to the first amplifying network and the second amplifying network; the first amplifying network and the second amplifying network receive one output of the first differential output signals each, and generate a first final output signal and a second final output signal respectively according to an externally input control voltage; and the boost network receives the first final output signal and the second final output signal, generates second differential output signals, and sends a first output and a second output of the second differential output signals to the first amplifying network and the second amplifying network, respectively.

10 Claims, 8 Drawing Sheets

CONTINUOUS VARIABLE GAIN AMPLIFIER

CROSS-REFERENCE TO RELATED APPLICATIONS

This application claims priority to Chinese Patent Application No. 201310002285.8, filed on Jan. 5, 2013, which is hereby incorporated by reference in its entirety.

TECHNICAL FIELD

The present invention relates to the field of electronics technologies, and in particular, to a continuous variable gain amplifier.

BACKGROUND

A system, for example, a microwave communication system, that requires an extremely small gain step (Step) of a variable gain amplifier (Variable Gain Amplifier, VGA for short), also has high requirements on linearity and noise, and it is costly to implement the requirements by using a programmable gain amplifier (Programmable Gain Amplifier, PGA for short) solution. Therefore, it is usually expected that a gain continuously change with a control voltage. That is, the requirements are implemented by using a continuous variable gain amplifier (Continuous VGA).

For continuous variable gain amplifiers in the prior art, some do not provide ideal linearity, and some cause a noise figure (Noise Figure, NF for short) to seriously deteriorate with attenuation of the gain.

SUMMARY

An embodiment of the present invention provides a continuous variable gain amplifier, which can solve an unideal linearity and improve an unideal noise-gain relationship.

In a first aspect, a continuous variable gain amplifier is provided, including an attenuator network, a boost network, a first amplifying network, and a second amplifying network, where the attenuator network consists of resistors and configured to adjust attenuation of the continuous variable gain amplifier; the boost network consists of resistors and configured to adjust a gain of the continuous variable gain amplifier; the attenuator network generates first differential output signals according to an input signal and sends the first differential output signals to the first amplifying network and the second amplifying network; the first amplifying network receives a first output of the first differential output signals sent by the attenuator network, and generates a first final output signal according to an externally input control voltage; the second amplifying network receives a second output of the first differential output signals sent by the attenuator network, and generates a second final output signal according to an externally input control voltage; the boost network receives the first final output signal output by the first amplifying network and the second final output signal output by the second amplifying network, generates second differential output signals, and sends a first output and a second output of the second differential output signals to the first amplifying network and the second amplifying network, respectively, where the first output and the second output of the second differential output signals are used by the first amplifying network and the second amplifying network to generate the first final output signal and the second final output signal, respectively; and during a gain status of the continuous variable gain amplifier, the attenuator network stops working, and the gain is adjusted by the boost network, and during an attenuation status of the continuous variable gain amplifier, the boost network stops working, and the gain is adjusted by the attenuator network.

In a first possible implementation, the attenuator network includes a first series of contact points and a second series of contact points in symmetry, configured to respond to the input signal, and generate the first output and the second output of a series of the first differential output signals at contact point pairs corresponding to the first series of contact points and the second series of contact points, respectively; the boost network includes a third series of contact points and a fourth series of contact points in symmetry, configured to respond to the first final output signal and the second final output signal, respectively, and generate the first output and the second output of a series of the second differential output signals at contact point pairs corresponding to the third series and the fourth series of contact points, respectively; the first amplifying network includes a first part of transconductance units and a second part of transconductance units with a joint output, configured to generate a first output signal, where each first input terminal of the first part of transconductance units is correspondingly connected to one of the first series of contact points of the attenuator network, second input terminals of the first part of transconductance units are connected to a contact point B1H of the third series of contact points of the boost network, all first input terminals of the second part of transconductance units are connected to a contact point A1H of the first series of contact points of the attenuator network, and each second input terminal of the second part of transconductance units is correspondingly connected to one of the third series of contact points of the boost network; the second amplifying network includes a third part of transconductance units and a fourth part of transconductance units with a joint output, configured to generate a second output signal, where each first input terminal of the third part of transconductance units is correspondingly connected to one of the second series of contact points of the attenuator network, all second input terminals of the third part of transconductance units are connected to a contact point B1L of the fourth series of contact points of the boost network, all first input terminals of the fourth part of transconductance units are connected to a contact point A1L of the second series of contact points of the attenuator network, and each second input terminal of the fourth part of transconductance units is correspondingly connected to one of the fourth series of contact points of the boost network.

With reference to the first possible implementation of the first aspect, in a second possible implementation, the first amplifying network further includes a first amplifying circuit, where the first amplifying circuit is connected to the first part of transconductance units and the second part of transconductance units, and responds to the first output signal to generate the first final output signal and output the first final output signal via a first final output terminal, where the first final output terminal is connected to the contact point B1H of the third series of contact points of the boost network; and the second amplifying network further includes a second amplifying circuit, where the second amplifying circuit is connected to the third part of transconductance units and the fourth part of transconductance units, and responds to the second output signal to generate the second final output signal and output the second final output signal via a second final output terminal, where the second final output terminal is connected to the contact point B1L of the fourth series of contact points of the boost network.

With reference to the second possible implementation of the first aspect, in a third possible implementation, the boost network responds to the first final output signal and the second final output signal, and sends the generated first output and second output of the second differential output signals to a second input terminal, connected to the boost network, of the second part of transconductance units and a second input terminal, connected to the boost network, of the fourth part of transconductance units, respectively.

With reference to the first to third possible implementations of the first aspect, in a fourth possible implementation, the first amplifying circuit or the second amplifying circuit includes a two-stage amplifying circuit, where a first stage of the first amplifying circuit receives the first output signal, and a first stage of the second amplifying circuit receives the second output signal.

With reference to the first to third possible implementations of the first aspect, in a fifth possible implementation, the contact point A1H is the first of the first series of contact points, the contact point A1L is the first of the second series of contact points, and the contact point A1H and the contact point A1L form a first contact point pair of the attenuator network, and when working states of transconductance unit pairs connected from the last to the first of the contact point pairs of the attenuator network change successively, the attenuation of the continuous variable gain amplifier during the attenuation status gradually decreases from maximum attenuation to zero; and the contact point B1H is the first of the third series of contact points, the contact point B1L is the first of the fourth series of contact points, and the contact point B1H and the contact point B1L form a first contact point pair of the boost network, and when working states of transconductance unit pairs connected from the first to the last of the contact point pairs of the boost network change successively, the gain of the continuous variable gain amplifier during the gain status gradually increases from zero to a maximum gain.

With reference to the first to third possible implementations of the first aspect, in a sixth possible implementation, first output terminals of the first part of transconductance units are connected to second output terminals of the second part of transconductance units, and second output terminals of the first part of transconductance units are connected to first output terminals of the second part of transconductance units, so as to jointly output the first output signal; and with reference to the first to third possible implementations of the first aspect, in a seventh possible implementation, first output terminals of the third part of transconductance units are connected to second output terminals of the fourth part of transconductance units, and second output terminals of the third part of transconductance units are connected to first output terminals of the fourth part of transconductance units, so as to jointly output the second output signal.

With reference to the first to third possible implementations of the first aspect, in an eighth possible implementation, the input signal is a pair of differential signals connected to the contact point pairs of the attenuator network.

With reference to the first to third possible implementations of the first aspect, in a ninth possible implementation, a transconductance unit includes a pair of differential triodes controlled by an inserted current source, and a working state of the transconductance unit is determined by controlling a bias current of the inserted current source.

With reference to the first aspect or the possible implementations of the first aspect, in a ninth possible implementation, an end of the attenuator network and an end of the boost network are connected to a common-mode voltage.

By using two resistor networks, the continuous variable gain amplifier provided in the embodiment of the present invention implements attenuation and gain and implements a continuous variable gain, thereby achieving good linearity. Further, during the whole gain status, a noise figure does not deteriorate with the decrease of the gain, that is, the noise-gain relationship is improved.

BRIEF DESCRIPTION OF DRAWINGS

To illustrate the technical solutions in the embodiments of the present invention more clearly, the following briefly describes the accompanying drawings required for describing the embodiments of the present invention. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

An embodiment of the present invention provide a continuous variable gain amplifier, which achieves good linearity, and improves a changing relationship between a gain and a noise figure or between attenuation and a noise figure in comparison with the prior art.

Figure 1:
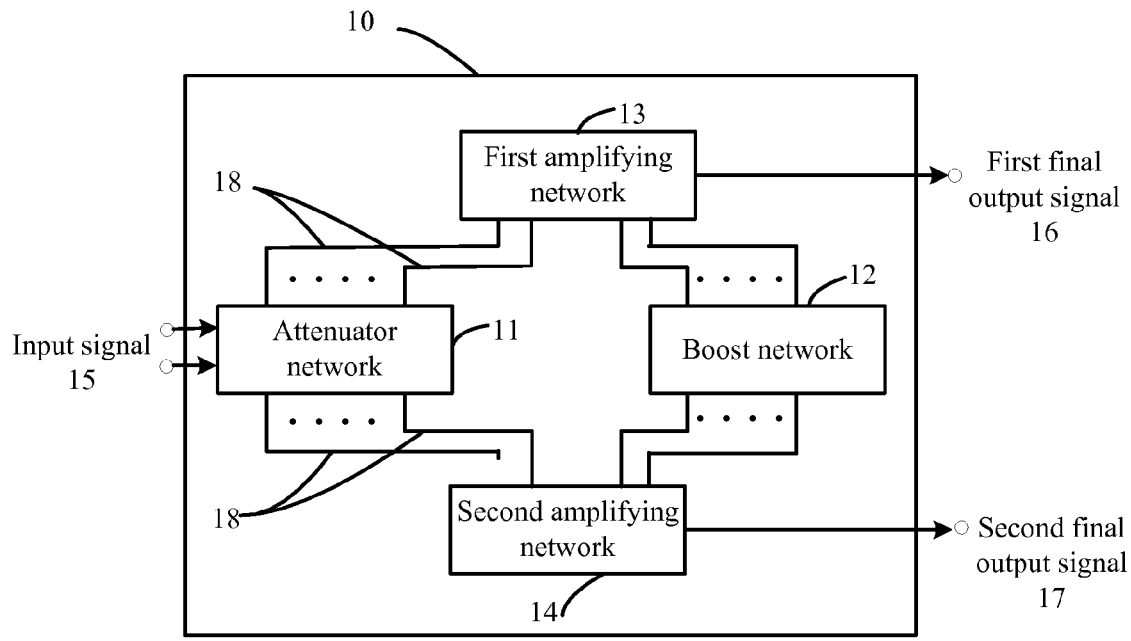
FIG. 1 is a schematic block diagram of a continuous variable gain amplifier according to a first embodiment of the present invention.

FIG. 1 is a schematic block diagram of a continuous variable gain amplifier 10 according to a first embodiment of the present invention. The continuous variable gain amplifier 10 includes: an attenuator (marked as R.Attenuator) network 11, a boost (marked as R.Boost) network 12, and two completely symmetrical amplifying networks, namely, a first amplifying network 13 and a second amplifying network 14.

The attenuator network consists of resistors and configured to adjust attenuation of the continuous variable gain amplifier; and the boost network consists of resistors and configured to adjust a gain of the continuous variable gain amplifier.

The attenuator network 11 generates first differential output signals 18 according to an input signal 15 and sends the first differential output signals 18 to the first amplifying network 13 and the second amplifying network; the first amplifying network 13 receives a first output of the first differential output signals 18 sent by the attenuator network 11, and generates a first final output signal 16 according to an externally input control voltage; the second amplifying network 14 receives a second output of the first differential output signals 18 sent by the attenuator network 11, and generates a second final output signal 17 according to an externally input control voltage; and the boost network 12 receives the first final output signal 16 output by the first amplifying network 13 and the second final output signal 17 output by the second amplifying network, generates second differential output signals 19, and sends a first output and a second output of the second differential output signals 19 to the first amplifying network 13 and the second amplifying network, respectively.

During a gain status of the continuous variable gain amplifier, that is, when the gain of the continuous variable gain amplifier is greater than 0, the attenuator network 11 stops working, and the gain is adjusted by a resistor of the boost network 12. In addition, during an attenuation status of the continuous variable gain amplifier, that is, the gain of the continuous variable gain amplifier is smaller than 0, the boost network 12 stops working, and the gain is adjusted by a resistor of the attenuator network 11.

By using two resistor networks, the continuous variable gain amplifier provided in this embodiment of the present invention implements attenuation and gain and implements a continuous variable gain, thereby achieving good linearity firstly. Secondly, because the boost network stops working during the attenuation status or the attenuator network stops working during the gain status, a chip current and a chip area can be saved. Finally, during the attenuation status of the continuous variable gain amplifier, that is, the stage in which the attenuator network works, the noise dB of the continuous variable gain amplifier increases with the attenuation of the gain dB, and an NF of the continuous variable gain amplifier deteriorates; however, during the gain status of the continuous variable gain amplifier, that is, the stage in which the boost network works, the noise of the continuous variable gain amplifier decreases with the decrease of the gain dB, and therefore the NF hardly deteriorates.

Optionally, the attenuator network includes a first series of contact points and a second series of contact points in symmetry, configured to respond to the input signal, and generate the first output and the second output of a series of the first differential output signals at contact point pairs corresponding to the first series of contact points and the second series of contact points, respectively. The boost network includes a third series of contact points and a fourth series of contact points in symmetry, configured to respond to the first final output signal and the second final output signal, respectively, and generate the first output and the second output of a series of the second differential output signals at contact point pairs corresponding to the third series of contact points and the fourth series of contact points, respectively. The first amplifying network include a first part of transconductance units and a second part of transconductance units with a joint output, configured to generate a first output signal, where each first input terminal of the first part of transconductance units is correspondingly connected to one of the first series of contact points of the attenuator network, second input terminals of the first part of transconductance units are connected to a contact point B1H of the third series of contact points of the boost network, all first input terminals of the second part of transconductance units are connected to a contact point A1H of the first series of contact points of the attenuator network, and each second input terminal of the second part of transconductance units is correspondingly connected to one of the third series of contact points of the boost network. The second amplifying network includes a third part of transconductance units and a fourth part of transconductance units with a joint output, configured to generate a second output signal, where each first input terminal of the third part of transconductance units is correspondingly connected to one of the second series of contact points of the attenuator network, all second input terminals of the third part of transconductance units are connected to a contact point B1L of the fourth series of contact points of the boost network, all first input terminals of the fourth part of transconductance units are connected to a contact point A1L of the second series of contact points of the attenuator network, and each second input terminal of the fourth part of transconductance units is correspondingly connected to one of the fourth series of contact points of the boost network.

Optionally, the first amplifying network further includes a first amplifying circuit, where the first amplifying circuit is connected to the first part of transconductance units and the second part of transconductance units, and responds to the first output signal to generate the first final output signal and output the first final output signal via a first final output terminal, where the first final output terminal is connected to the contact point B1H of the third series of contact points of the boost network; and the second amplifying network further includes a second amplifying circuit, where the second amplifying circuit is connected to the third part of transconductance units and the fourth part of transconductance units, and responds to the second output signal to generate the second final output signal and output the second final output signal via a second final output terminal, where the second final output terminal is connected to the contact point B1L of the fourth series of contact points of the boost network.

Optionally, the boost network responds to the first final output signal and the second final output signal to generate the first output and the second output of the second differential output signals, and sends the generated first output and second output of the second differential output signals to a second input terminal, connected to the boost network, of the second part of transconductance units and a second input terminal, connected to the boost network, of the fourth part of transconductance units, respectively.

Optionally, the first amplifying circuit or the second amplifying circuit includes a two-stage amplifying circuit, where a first stage of the first amplifying circuit receives the first output signal, and a first stage of the second amplifying circuit receives the second output signal.

Optionally, the contact point A1H is the first of the first series of contact points, the contact point A1L is the first of the second series of contact points, and the contact point A1H and the contact point A1L form a first contact point pair of the attenuator network; and when working states of transconductance unit pairs connected from the last to the first of the contact point pairs of the attenuator network change successively, the attenuation of the continuous variable gain amplifier during the attenuation status gradually decreases from maximum attenuation to zero. The contact point B1H is the first of the third series of contact points, the contact point B1L is the first of the fourth series of contact points, and the contact point B1H and the contact point B1L form a first contact point pair of the boost network; and when working states of transconductance unit pairs connected from the first to the last of the contact point pairs of the boost network change successively, the gain of the continuous variable gain amplifier during the gain status gradually increases from zero to a maximum gain.

Optionally, first output terminals of the first part of transconductance units are connected to second output terminals of the second part of transconductance units, and second output terminals of the first part of transconductance units are connected to first output terminals of the second part of transconductance units, so as to jointly output the first output signal; and first output terminals of the third part of transconductance units are connected to second output terminals of the fourth part of transconductance units, and second output terminals of the third part of transconductance units are connected to first output terminals of the fourth part of transconductance units, so as to jointly output the second output signal.

Optionally, the input signal is a pair of differential signals connected to the contact point pairs of the attenuator network.

Optionally, the transconductance unit includes a pair of differential triodes controlled by an inserted current source, and a working state of the transconductance unit is determined by controlling a bias current of the inserted current source.

Optionally, an end of the attenuator network and an end of the boost network are connected to a common-mode voltage.

Figure 2A:
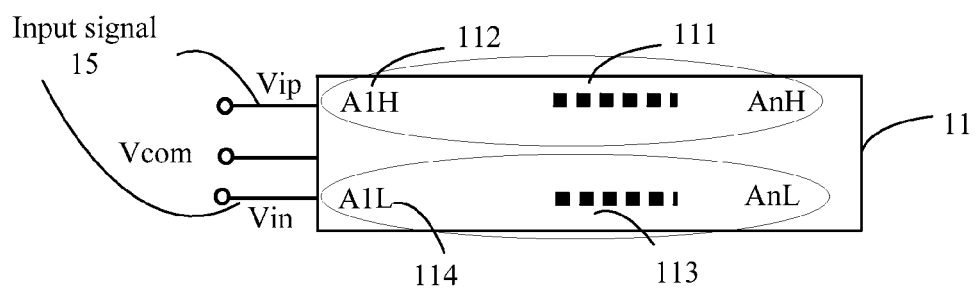
FIG. 2A and FIG. 2B are schematic block diagrams of an attenuator network according to a second embodiment of the present invention.

FIG. 2A is a schematic block diagram of an attenuator network 11 according to a second embodiment of the present invention. FIG. 2A shows an implementation manner of the attenuator network 11.

The attenuator network 11 consists of resistors, and includes two groups of symmetrical contact points: a first series of contact points 111 and a second series of contact points 113. For example, both the first series of contact points 111 and the second series of contact points 113 have n contact points, A1H to AnH and A1L to AnL, where n is a positive integer. The contact point A1H 112 of the first series of contact points 111 and the contact point A1L 114 of the second series of contact points 113 are the first of the first series of contact points and the first of the second series of contact points, respectively, and the contact point AnH of the first series of contact points 111 and the contact point AnL of the second series of contact points 113 are the last of the first series of contact points and the last of the second series of contact points, respectively. A1H and A1L or AnH and AnL are a group of corresponding contact points, which is also called a contact point pair. An input signal 15 is differential signals, where one output is connected to A1H, as illustrated by Vip in FIG. 2A, and another output is connected to A1L, as illustrated by Vin in FIG. 2A. The attenuator network responds to the input signal 15, and generates a series of first differential output signals 18 at contact point pairs corresponding to the first series of contact points and the second series of contact points. For ease of description, the first differential output signals output from the first series of contact points are called a first output of the first differential output signals, and the first differential output signals output from the second series of contact points are called a second output of the first differential output signals.

Figure 2B:
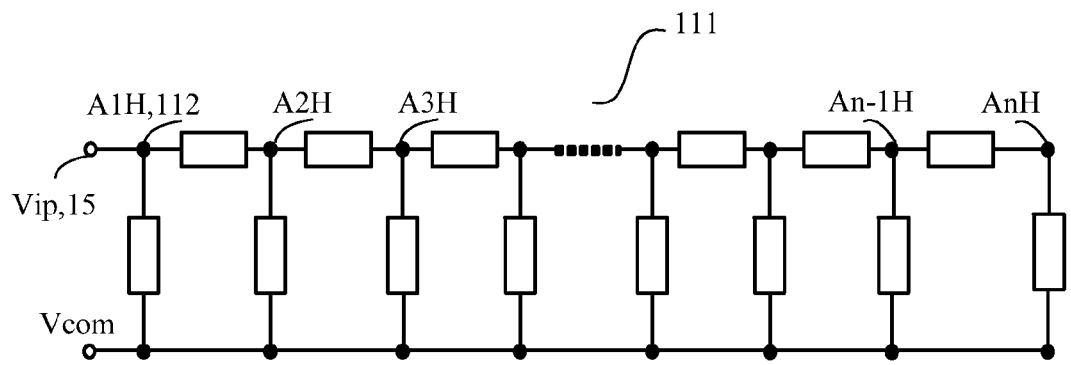

FIG. 2B is a schematic block diagram of a part 111 of the attenuator network 11 according to the second embodiment of the present invention. FIG. 2B illustrates a specific implementation manner by taking the first series of contact points 111 as an example. The attenuator network is a π resistance network and can implement dB linearity of attenuation. Because the first series of contact points 111 and the second series of contact points 113 are completely symmetrical, the second series of contact points 113 will not be described again for simplicity. An end of the attenuator network is connected to a common-mode voltage Vcom.

Figure 3A:
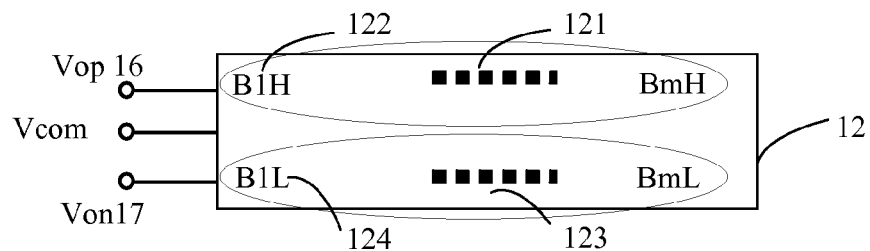
FIG. 3A and FIG. 3B are schematic block diagrams of a boost network according to a third embodiment of the present invention.

The first amplifying network 13 selects a signal output by one contact point or jointly by more contact points of the part 111 of the attenuator network 11 as one input signal of an internal amplifier. FIG. 3A is a schematic block diagram of a boost network 12 according to a third embodiment of the present invention.

The boost network 12 consists of resistors, and includes two groups of symmetrical contact points: a third series of contact points 121 and a fourth series of contact points 123. For example, both the third series of contact points 121 and the fourth series of contact points 123 have m contact points, B1H to BmH and B1L to BmL, where m is a positive integer. The contact point B1H 122 of the third series of contact points 121 and the contact point B1L 124 of the fourth series of contact points 123 are the first of the third series of contact points and the first of the fourth series of contact points, respectively, and the contact point BmH of the third series of contact points 121 and the contact point BmL of the fourth series of contact points 123 are the last of the third series of contact points and the last of the fourth series of contact points, respectively. B1H and B1L or BmH and BmL are a group of corresponding contact points, which is also called a contact point pair. The boost network responds to a first final output signal Vop 16 and a second final output signal Von 17, and generates a series of second differential output signals 19 at contact point pairs corresponding to the third and the fourth series of contact points. For ease of description, the second differential output signals output from the third series of contact points are called a first output of the second differential output signals, and the second differential output signals output from the fourth series of contact points are called a second output of the second differential output signals.

Figure 3B:
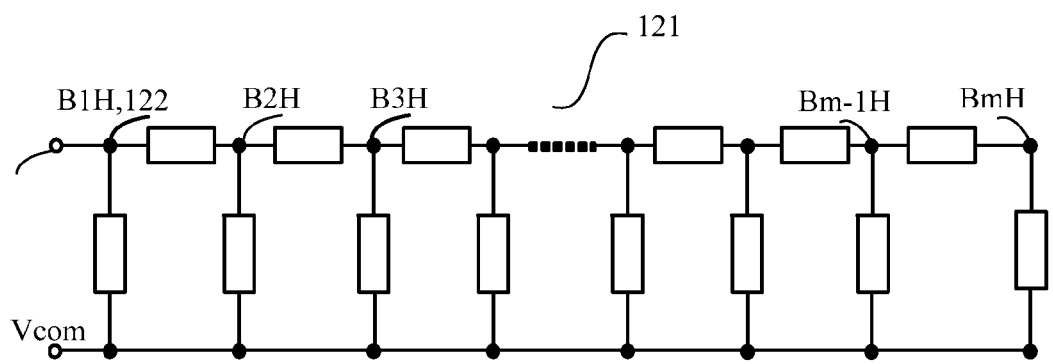

FIG. 3B is a schematic block diagram of a part 121 of the boost network 12 according to the third embodiment of the present invention. FIG. 3B illustrates a specific implementation manner by taking the third series of contact points 121 as an example. The boost network is a π resistance network, and can implement dB linearity of a gain. Because the third series of contact points 121 and the fourth series of contact points 123 are completely symmetrical, the fourth series of contact points 123 will not be described again for simplicity. An end of the boost network is connected to a common-mode voltage Vcom.

The first amplifying network 13 selects a signal output by one contact point or jointly by more contact points of the part 121 of the boost network 12 as another input signal of the internal amplifier.

Because the first amplifying network 13 and the second amplifying network 14 are in a symmetrical relationship, for simplicity, only the components of the first amplifying network 13 are described. The structure and signal processing of the second amplifying network 14 are similar and will not be described again.

Optionally, as a specific embodiment of the present invention, an amplifying network may include multiple transconductance units and amplifying circuits. The transconductance units select output signals of different contact points of the attenuator network or the boost network according to whether the transconductance units are working All contact points are fixed, and whether a transconductance unit is working and what the working status is like can be obtained according to a continuous variable current of the transconductance unit. The continuous variable current is controlled by a control voltage Vctrl which is provided externally. The control voltage is briefed as Vctrl.

Subsequently, a transconductance unit and an amplifying circuit that are included in the first amplifying network are exemplified.

Figure 4A:
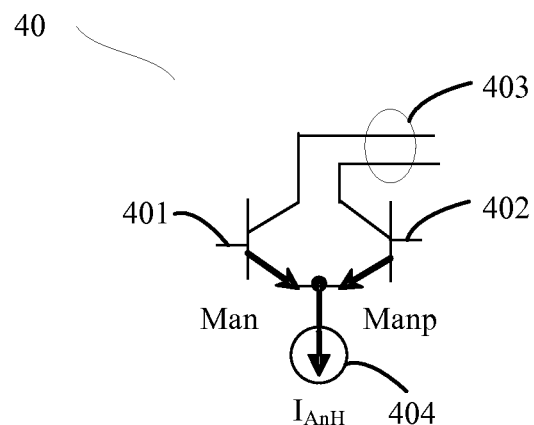
FIG. 4A is a schematic block diagram of a transconductance unit of a first amplifying network according to a fourth embodiment of the present invention.

FIG. 4A is a schematic principle diagram of a transconductance unit 40 of the first amplifying network 13 according to a fourth embodiment of the present invention.

Figure 4B:
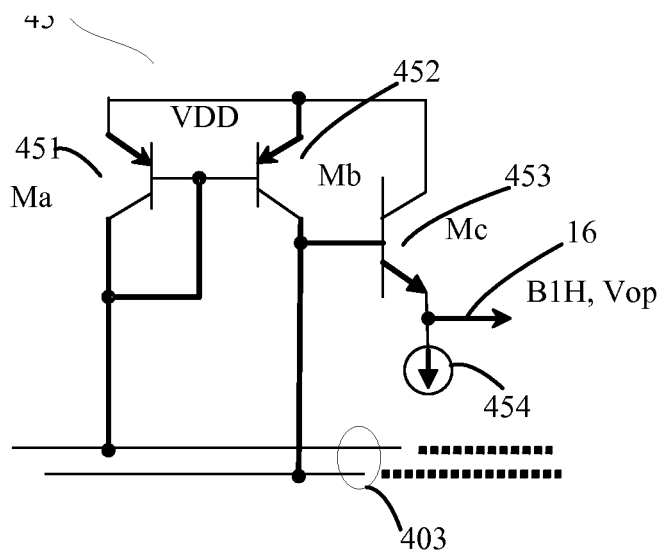
FIG. 4B is a schematic block diagram of a first amplifying circuit of a first amplifying network according to the fourth embodiment of the present invention.

The first amplifying circuit includes multiple transconductance units 40. Herein, transconductance units connected to the first series of contact points are called the first part of transconductance units, and transconductance units connected to the third series of contact points are called the second part of transconductance units. A transconductance unit 40 includes two differential triodes. The first part of transconductance units are denoted by Man and Manp (where n is a positive integer), and the second part of transconductance units are denoted by Mgm and Mgmp (where m is a positive integer). A working state of the transconductance unit 40 may be controlled by a bias current 404 provided by an inserted current source. Taking the last of the first part of transconductance units as an example, as shown in FIG. 4A, the two differential triodes of the transconductance unit are denoted by Man and Manp, and a controlled bias current is $I_{AnH}$. For example, when the bias current of the transconductance unit increases from zero, the transconductance unit gradually changes from not working to working. The input terminal of one triode of the two differential triodes, such as Man or Mgm, is a non-inverting input terminal of the amplifier, and is called a first input terminal 401 herein. The input terminal of the other triode, such as Manp or Mgmp, is an inverting input terminal of the amplifier, and is called a second input terminal 402 herein. Each first input terminal 401 of the first part of transconductance units 40 is connected to one corresponding contact point among the first series of contact points such as A1H to AnH of the attenuator network, and all the second input terminals are connected to the contact point B1H 122 of the third series of contact points of the boost network. All first input terminals of the second part of transconductance units 40 are connected to the contact point A1H 112 of the first series of contact points of the attenuator network, and each second input terminal 402 is connected to one corresponding contact point among the third series of contact points such as B1H to BmH of the boost network. The first part of transconductance units and the second part of transconductance units 40 generate a first output signal 403 according to signals received by their respective first input terminals and second input terminals, and jointly send the first output signal 403 to a first amplifying circuit 45. FIG. 4B is a schematic principle diagram of the first amplifying circuit 45 of the first amplifying network according to the fourth embodiment of the present invention.

Correspondingly, the second amplifying network also includes multiple transconductance units 40 with a joint output, where transconductance units connected to the second series of contact points are called the third part of transconductance units, and transconductance units connected to the fourth series of contact points are called the fourth part of transconductance units. The third part of transconductance units and the fourth part of transconductance units are configured to generate a second output signal, where each first input terminal of the third part of transconductance units is connected to one corresponding contact point among the second series of contact points such as A1L to AnL of the attenuator network, and all the second input terminals are connected to the contact point B1L of the fourth series of contact points of the boost network. All the first input terminals of the fourth part of transconductance units are connected to the contact point A1L of the second series of contact points of the attenuator network, and each second input terminal is connected to one corresponding contact point among the fourth series of contact points such as B1L to BmL of the boost network.

One of the first part of transconductance units of the first amplifying network and one of the third part of transconductance units of the second amplifying network form a transconductance unit pair via a contact point pair of the attenuator network, can generate the first differential output signals and the second differential output signals, and send the first differential output signals and the second differential output signals to the first amplifying circuit and the second amplifying circuit, respectively, so as to finally output the first differential output signals and the second differential output signals which are mutually inverting, without the need of any additional inverter. In many applications, this method provides particular benefits.

Similarly, one of the second part of transconductance units of the first amplifying network and one of the fourth part of transconductance units of the second amplifying network form a transconductance unit pair via a contact point pair of the boost network, can generate the first differential output signals and the second differential output signals, and send the first differential output signals and the second differential output signals to the first amplifying circuit and the second amplifying circuit, respectively. The benefits are the same as above.

Specifically, regarding the variable gain amplifier of this embodiment of the present invention, the gain and the attenuation thereof are continuously adjustable because different transconductance units select different contact points of the boost network and the attenuator network. This is implemented by using the control voltage Vctrl of the variable gain amplifier to continuously change a bias current of each transconductance unit, that is, the bias current 404 in FIG. 4A. Though the transconductance units are connected to different contact points of the boost network or the attenuator network, whether each transconductance unit works is controlled by existence of its bias current 404, and the bias current of each transconductance unit is controlled by the control voltage Vctrl of the VGA. The sum of the bias currents of all the transconductance units of the VGA is fixed, and the Vctrl controls the bias current of each transconductance unit. As the Vctrl gradually increases from 0 V to a maximum value, the current of each transconductance unit is continuously switched, thereby implementing the VGA with a continuous variable gain or continuous variable attenuation.

Figure 9:
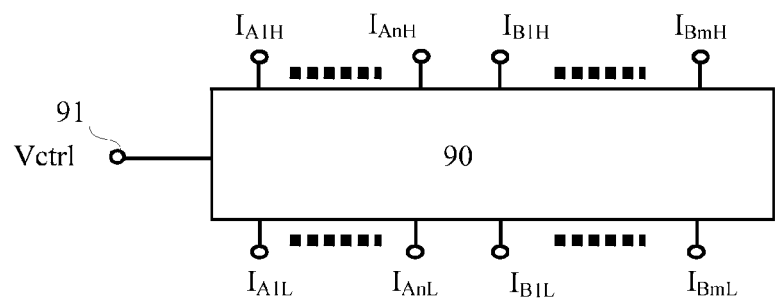
FIG. 9 is a schematic diagram of a current generator controlled by a control voltage of a VGA according to the fifth embodiment of the present invention.
Figure 10:
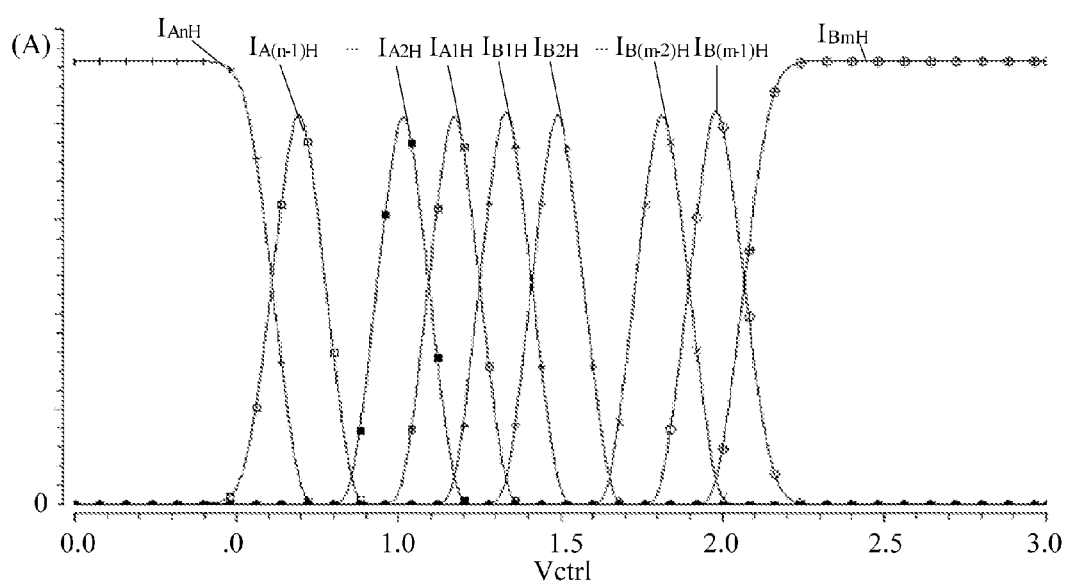
FIG. 10 is a schematic diagram of a relationship between a control voltage and bias currents of a VGA according to the fifth embodiment of the present invention.

FIG. 9 is a schematic diagram of a current generator 90 controlled by a control voltage Vctrl of a VGA according to an embodiment of the present invention. The current generator 90 is an existing technology, FIG. 9 omits a specific circuit, and merely schematically illustrates that, when an externally input control voltage Vctrl 91 changes, the current generator controlled by the Vctrl outputs a bias current such as $I_{A1H}$ at different output terminals according to the change of the Vctrl. FIG. 10 is a schematic diagram of a relationship between a control voltage and bias currents of a VGA according to an embodiment of the present invention. For clarity, different bias currents in FIG. 10 are indicated by wave curves with different symbols. In this case, the changing trend of each bias current increasing from zero and then decreasing to zero is apparent. When a bias current passes through a transconductance unit connected to an output terminal of the current generator, the working state starts to be switched.

Figure 5:
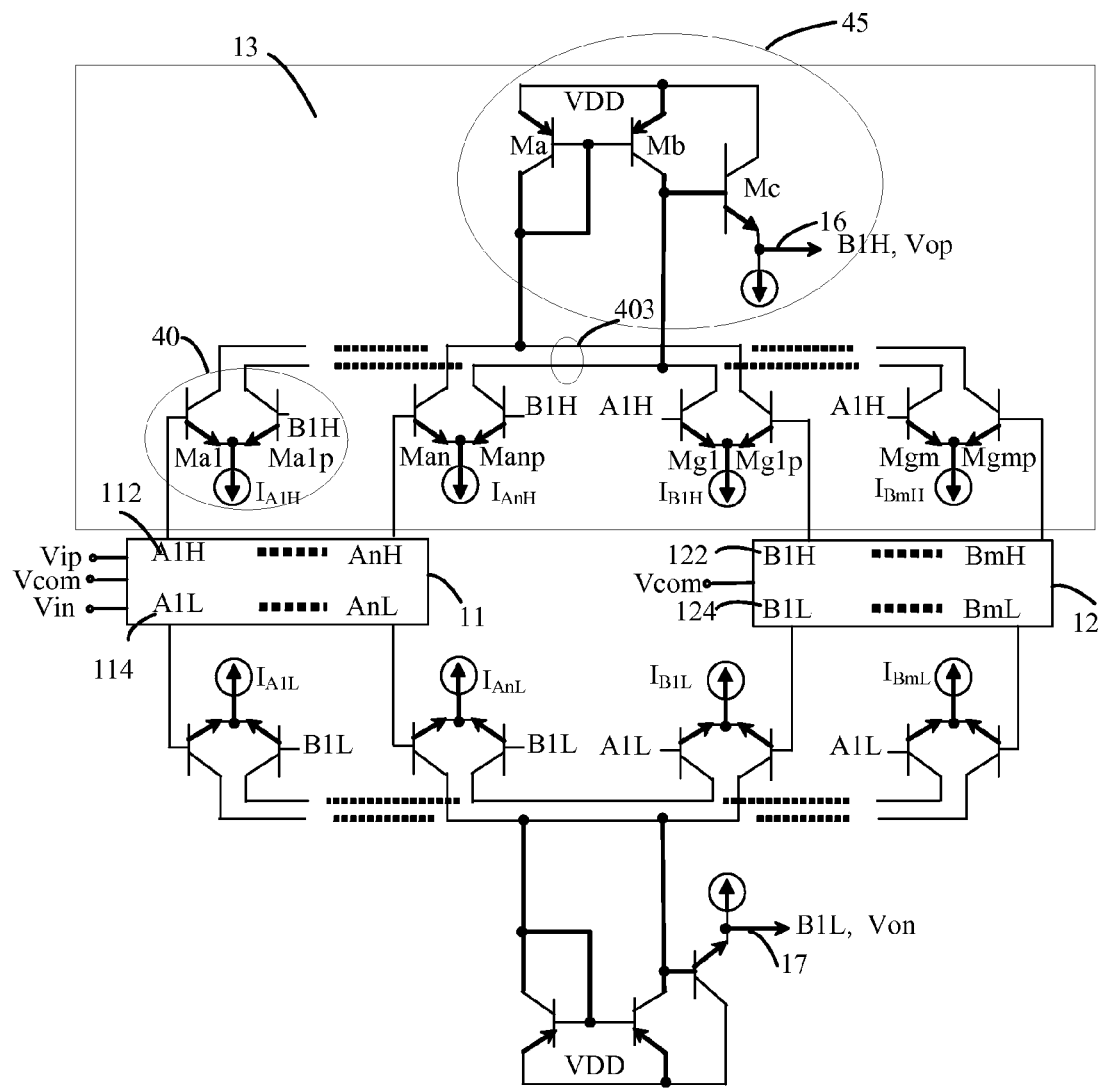
FIG. 5 is a schematic circuit diagram of a continuous variable gain amplifier according to a fifth embodiment of the present invention.

Specifically, taking the first part of transconductance units of the attenuator network as an example, when the Vctrl is 0 V, only a transconductance unit connected to the contact point AnH (the last one from left to right of the attenuator network in FIG. 5) has a bias current, and bias currents of all other transconductance units are zero. In this case, the attenuation of the VGA is the greatest. As the Vctrl gradually increases, the current of the transconductance unit connected to the contact point AnH gradually decreases, and a current of a transconductance unit connected to the contact point An−1H (the first one on the left of AnH) gradually increases, thereby continuously switching the working state of each transconductance unit. Because the contact points of the resistors of the attenuator network connected to the transconductance units that are connected to the contact points AnH and An−1H are different, attenuation degrees are different. Since the working states of the transconductance units connected to the contact points AnH and An−1H of the attenuator network can be switched continuously, the attenuation is continuously adjustable. As the Vctrl gradually increases, working states of the transconductance units connected to the contact points AnH to A1H are switched one by one, and the VGA continuously changes from the maximum attenuation to zero attenuation during the attenuation status. As the Vctrl further increases, the attenuator network stops working Referring to the boost network in FIG. 3B, from left to right, the bias currents of the transconductance units connected to the contact points of the attenuator network change correspondingly, and the connected transconductance units change from not working to working one by one, thereby implementing the changing trend of the gain from small to large during the gain status of the VGA. When and only when a transconductance unit connected to the contact point BmH on the right-most of the boost network works, the gain of the VGA reaches the maximum value.

Because the first part of transconductance units and the third part of transconductance units are connected to a contact point pair of the attenuator network, where the contact point pair acts as resistors whose other ends are connected to the input signals Vip and Vin, the signals input to the first amplifying circuit and the second amplifying circuit are still differential signals. The second part of transconductance units and the fourth part of transconductance units are connected to a contact point pair of the boost network, where the same principle applies.

In addition, during the gain status, that is, the stage in which the gain is greater than 0, referring to the boost network in FIG. 3B, when the gain gradually decreases from the maximum gain, a resistor contacted by an effectively working transconductance pair that is controlled by the continuously switching current, that is, an equivalent noise contribution resistance value, is also decreasing. In this way, although the gain dB decreases, the noise dB decreases correspondingly and the NF therefore remains almost unchanged. That is to say, during a stage in which the gain of the VGA is greater than zero, the NF is constant and does not deteriorate with the decrease of the gain.

Referring to FIG. 4B, the first amplifying circuit 45 includes a simplified two-stage amplifying circuit. Input terminals of two transistors Ma 451 and Mb 452 of a first-stage amplifier are connected to output terminals of two transistors of the transconductance unit 40, and are configured to receive the first output signal 403 of the transconductance unit 40. Specifically, the first output terminals of the first part of transconductance units and the second output terminals of the second part of transconductance units are connected to the input terminal of Ma 451, and the second output terminals of the first part of transconductance units and the first output terminals of the second part of transconductance units are connected to the input terminal of Mb 452. After the signal is amplified by the first-stage amplifier, the first final output signal Vop 16 is finally output at the output terminal of a second-stage amplifier Mc 453. The output terminal of the second-stage amplifier 453 is connected to the contact point B1H 122 of the third series of contact points of the boost network. In addition, a bias current of the output terminal of the amplifier 453 may be controlled by an inserted current source 454.

Correspondingly, the second amplifying circuit also includes a two-stage amplifying circuit. Two transistors of a first-stage amplifier are connected to the output terminals of the two transistors of the transconductance unit, and are configured to receive the second output signal of the transconductance unit, and the second final output signal Vop 17 is finally output at the output terminal of a second-stage amplifier. The output terminal of the second-stage amplifier is connected to the contact point B1L 122 of the fourth series of contact points of the boost network. In addition, a bias current of the output terminal of the second-stage amplifier may be controlled by the inserted current source.

FIG. 5 is a schematic circuit diagram of a continuous variable gain amplifier 50 according to a fifth embodiment of the present invention.

In this embodiment of the present invention, an input signal, as differential signals, is split into two outputs, Vip and Vin, which are connected to a pair of contact points (AnH and AnL) of the attenuator network. Subsequently, for simplicity, descriptions are made by taking the first amplifying network as an example, and a principle of the second amplifying network is similar.

The input signal Vip is output to a first input terminal of a transconductance unit of the first amplifying network via the attenuator network. The transconductance unit generates a first output signal based on the input, and sends the first output signal to an input terminal of a triode of the first-stage amplifier of the first amplifying circuit. The first-stage amplifier of the first amplifying circuit, for example, includes a triode Ma and a triode Mb, and the second-stage amplifier includes a triode Mc. Meanwhile, after being input to the B1H of the third series of contact points of the boost network via the output terminal of the first amplifying circuit, the first final output signal is input to the input terminal of the other triode of the first-stage amplifier as a signal of the inverting input terminal of the transconductance unit. After two-stage amplification, the output terminal of the second-stage amplifier of the first amplifying circuit outputs the first final output signal.

During the whole attenuation status of the continuous variable gain amplifier, a second input of each transconductance unit connected to the attenuator network is connected to the B1H. Whether the whole attenuator network and corresponding transconductance pairs work depends on the bias currents controlled by the Vctrl. In this case, the B1H of the boost network is connected to the Vop. When the attenuator network works, under the effect of the Vctrl, the bias currents of the transconductance units connected to the whole boost network are 0, and no transconductance unit connected to the whole boost network works. In this case, only the attenuator network works.

During the whole gain status of the continuous variable gain amplifier, a first input of each transconductance unit connected to the boost network is connected to the A1H. Whether the whole boost network and corresponding transconductance pairs work depends on the bias currents controlled by the Vctrl. In this case, the A1H of the attenuator network is connected to the Vip. When the boost network works, under the effect of the Vctrl, the bias currents of the transconductance units of the whole attenuator network are 0, and no transconductance unit connected to the whole attenuator network works. In this case, only the boost network works.

By using two resistor networks, the continuous variable gain amplifier provided in this embodiment of the present invention implements attenuation and gain and implements a continuous variable gain, thereby achieving good linearity firstly. Secondly, because the boost network stops working during the attenuation status or the attenuator network stops working during the gain status, a chip current and a chip area can be saved. Finally, during the attenuation status of the continuous variable gain amplifier, that is, the stage in which the attenuator network works, the noise dB of the continuous variable gain amplifier increases with the attenuation of the gain dB, and an NF of the continuous variable gain amplifier deteriorates accordingly; however, during the gain status of the continuous variable gain amplifier, that is, the stage in which the boost network works, the noise of the continuous variable gain amplifier decreases with the decrease of the gain dB, and therefore the NF hardly deteriorates.

Figure 6:
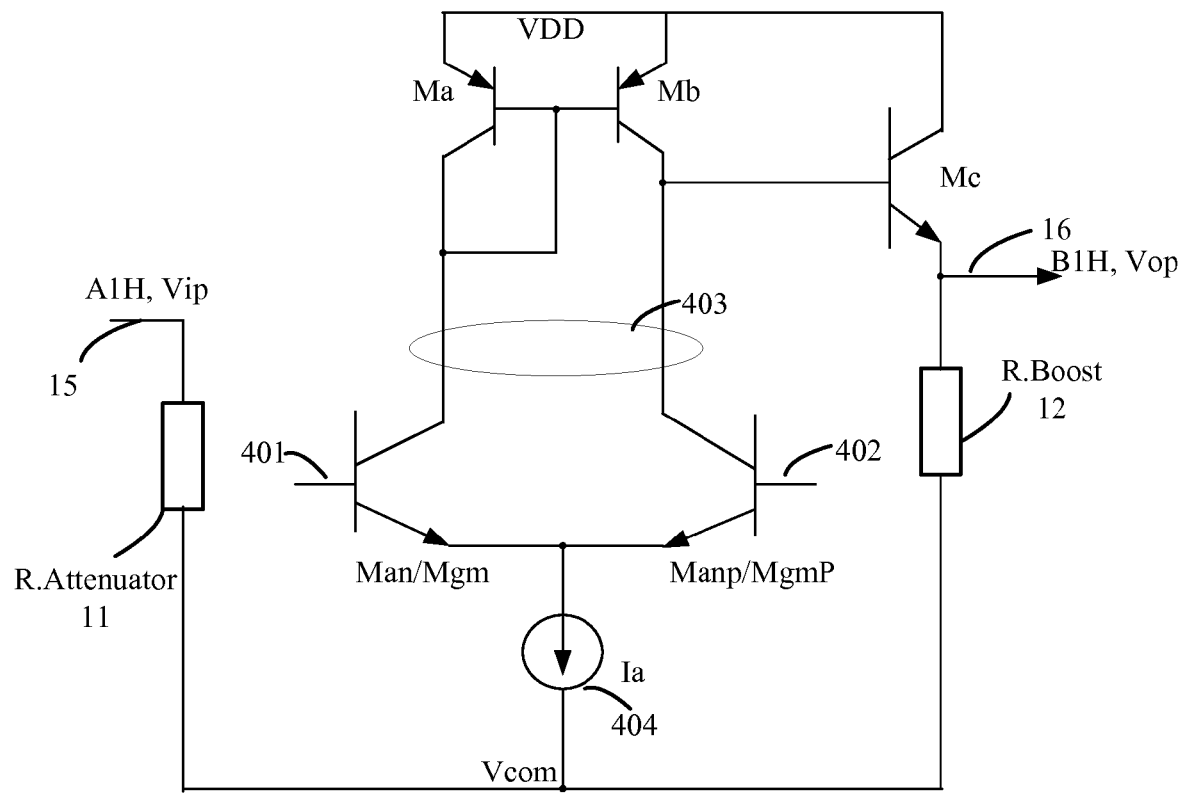
FIG. 6 is a circuit principle diagram of a continuous variable gain amplifier according to the fifth embodiment of the present invention.

FIG. 6 is a circuit principle diagram of the continuous variable gain amplifier 50 according to an embodiment of the present invention. For clarity, the figure illustrates only the upper half circuit of the continuous variable gain amplifier 50. For ease of illustration, FIG. 6 gives a simplified circuit diagram of a connection relationship between a working transconductance unit and a bias current controlled by the Vctrl and specific contact points of the attenuator network or boost network.

During the gain status of the continuous variable gain amplifier, the first input terminal 401 of the transconductance unit is connected to the A1H. In this case, the Vip is connected to the A1H, that is, the attenuator network (R.Attenuator) stops working and the gain amplitude is determined by the boost network (R.Boost). In this case, the noise of the VGA consists of noise of the boost network and noise of the first amplifying circuit, and is irrelevant with the attenuator network. In addition, when the transconductance unit Mg1 connected to the contact point B1H of the boost network works, the boost network stops working During the attenuation status of the continuous variable gain amplifier, the second input terminal 402 of the transconductance unit is connected to the B1H. In this case, the Vop is connected to the B1H, that is, the boost network stops working and the attenuation amplitude is determined by the attenuator network. In this case, the noise of the VGA consists of noise of the attenuator network and noise of the first amplifying circuit, and is irrelevant with the boost network.

The above two points indicate that, during the gain status of the continuous variable gain amplifier, no noise of the continuous variable gain amplifier is contributed by the attenuator network. The reason is that, during the gain status, the currents of the transconductance units corresponding to the attenuator network are zero, that is, the transconductance units connected to the contact points of the attenuator network do not work. Because the attenuator network stops working, there is no resistance noise contribution of the attenuator network. Similarly, during the attenuation status of the continuous variable gain amplifier, no noise of the continuous variable gain amplifier is contributed by the boost network. The reasons is that, during the attenuation status, the currents of transconductance units corresponding to the boost network are zero, that is, the transconductance units connected to the contact points of the boost network do not work. Because the boost network stops working, there is no resistance noise contribution of the boost network, either. Therefore, the change of the NF and the gain is different from that in the prior art. The continuous VGA of the embodiment of the present invention is capable of adjusting the attenuation and the gain. When only the boost network works, that is, when the transconductance unit pairs connected to the contact point pairs work successively from right to left, the gain of the continuous variable gain amplifier gradually decreases from the maximum gain. In this case, when the gain of the boost network gradually decreases from the maximum gain, the noise also gradually decreases with the decrease of the gain, and therefore the NF remains almost unchanged.

Figure 7:
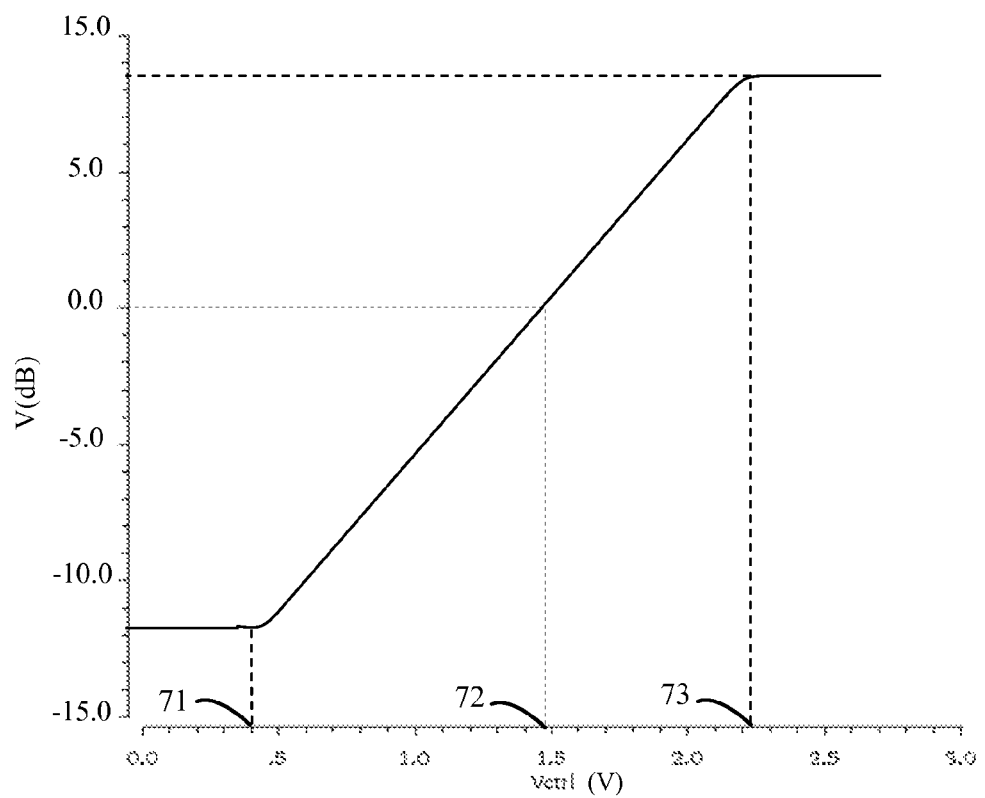
FIG. 7 is a schematic diagram of a relationship between a gain and a control voltage of a continuous variable gain amplifier according to the fifth embodiment of the present invention.
Figure 8:
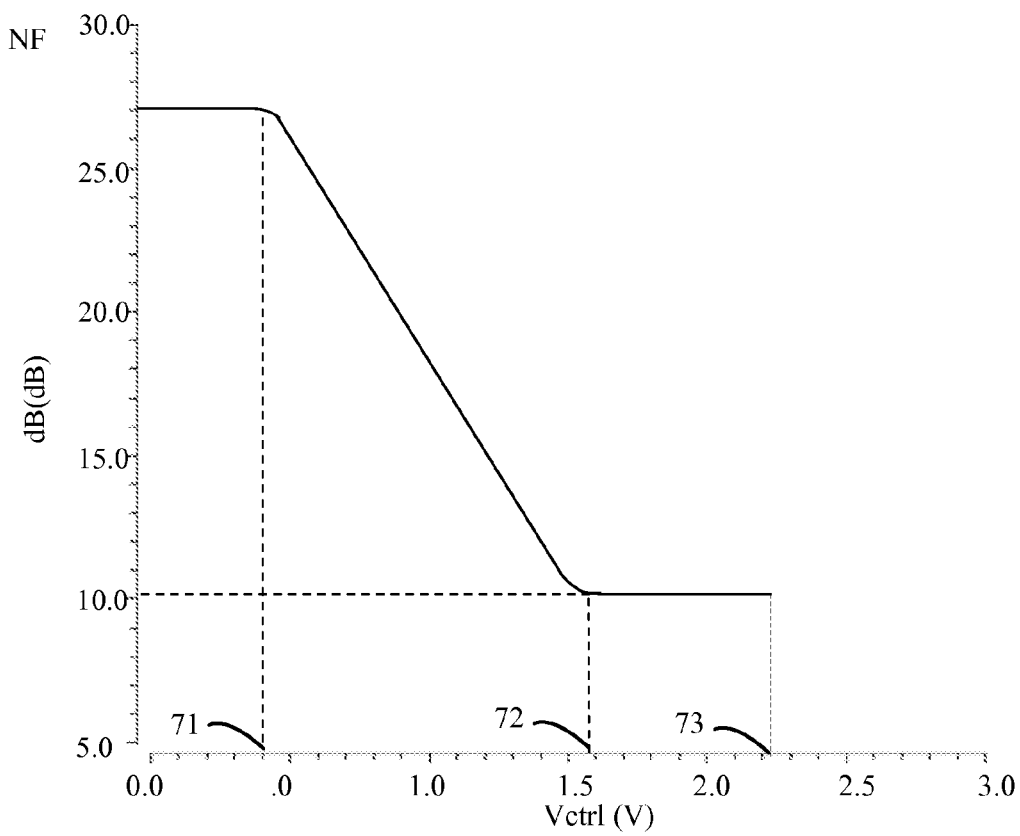
FIG. 8 is a schematic diagram of a relationship between an NF and a control voltage of a continuous variable gain amplifier according to the fifth embodiment of the present invention.

According to a simulation result of the continuous variable gain amplifier of the embodiment of the present invention, when both input impedance and output impedance are 50 ohm, specific conditions of the gain and the NF are illustrated in FIG. 7 and FIG. 8, respectively.

FIG. 7 is a schematic diagram of a relationship between a gain and an external control voltage Vctrl of a continuous variable gain amplifier according to the fifth embodiment of the present invention. The gain amplitude of the variable gain amplifier and the amplitude of the external control voltage vary with design requirements, and the illustration herein is merely exemplary.

As shown in FIG. 7, the horizontal axis represents the control voltage, and the vertical axis represents the gain of the continuous variable gain amplifier. On the vertical axis, the negative numbers below zero of the gain indicate gain values of the continuous variable gain amplifier during the attenuation status, and the positive numbers above zero of the gain indicates gain values of the continuous variable gain amplifier during the gain status.

The following uses only the upper half circuit of the continuous variable gain amplifier 50 to exemplify the explanation. The lower half is completely symmetrical with the upper half and works under the same principle, and will not be described herein for simplicity. In this embodiment of the present invention, the sum of the bias currents of all the first part of transconductance units and a second part of transconductance units is a fixed value. That is, $$\left( \sum_{i=1}^{n} I_{A(i)H} + \sum_{j=1}^{m} I_{B(j)H} \right)$$

is a fixed value, and does not change with the change of the Vctrl.

Referring to FIG. 7, when the Vctrl is very low, for example, lower than 0.4 V, only the current $I_{AnH}$ exists. Because the sum of all the bias currents is a fixed value, all the other bias currents are zero, and therefore only the transconductance unit connected to the bias current $I_{AnH}$ works. In this case, no other transconductance units work because the bias currents thereof are zero. The first input terminal of the transconductance unit is connected to the maximum attenuation point AnH of the attenuation resistor network and the second input terminal is connected to the B1H. The B1H is on the left-most side of the boost resistor network, and is the first contact point. In this case, the whole VGA achieves the maximum attenuation, and the attenuation amplitude equals the attenuation amplitude at the point AnH of the attenuation resistor network.

Still referring to FIG. 7, when the Vctrl is 0.7 V, only the bias current $I_{A(n-1)H}$ exists, and all the other bias currents are zero. In this case, only the transconductance unit connected to the bias current $I_{A(n-1)H}$ works. The first input terminal of the transconductance unit is connected to the point A(n−1)H of the attenuation resistor network, where the attenuation at the point A(n−1)H is a little smaller than that at the maximum attenuation point AnH, and the right side is connected to the B1H. The B1H is on the left-most side of the boost network, and is the first contact point. No other transconductance units work because the bias currents thereof are zero. In this case, the attenuation amplitude of the whole VGA equals the attenuation amplitude at the point A(n−1)H of the attenuation resistor network.

Referring to when the Vctrl equals 0.4 V and 0.7 V again, the attenuation amplitudes at the two points AnH and A(n−1)H of the attenuator network are determined by the resistor network, and are two different values. Then, how does the VGA achieve continuous attenuation change between the two points? When the Vctrl is between 0.4 V and 0.7 V, only the currents $I_{AnH}$ and $I_{A(n-1)H}$ exist, and because the sum of $I_{AnH}$ and $I_{A(n-1)H}$ is a fixed value, all the other bias currents are zero. The two transconductance units connected to the bias currents $I_{AnH}$ and $I_{A(n-1)H}$ work, but the working status of the two transconductance units are determined by the intensities of the bias currents. In addition, the current intensities determine the degree of contribution of the transconductance units to the whole attenuation amount.

By analogy, with the continuous change of the Vctrl, the attenuation of the VGA also changes continuously. During the gain status, the working relationship between the boost network and the corresponding transconductance units and bias currents is also continuous, thereby achieving a continuous variable gain. Therefore, the continuous change of the gain/attenuation of the VGA is implemented by using the Vctrl to adjust bias currents of different transconductance units.

As can be seen from FIG. 7, as the control voltage starts increasing from 0 V, when the control voltage is at a first voltage 71 between 0 V and 0.4 V, the gain of the variable gain amplifier starts to change from the maximum attenuation to the maximum gain. In this case, the boost network stops working, and only the transconductance unit pair connected from the last contact point pair AnH and AnL of the attenuator network works. When the control voltage is at a second voltage 72 between 1 V and 1.5 V, the gain output of the variable gain amplifier is 0. In this case, the input signals Vip and Vin are connected to the A1H and A1L of the attenuation resistor network, and only the transconductance unit pair connected to the A1H and A1L and the transconductance unit pair connected to the B1H and B1L work. When the control voltage changes from the second voltage 72 to a third voltage 73 above 2.5 V, the attenuator network stops working, and only the transconductance unit pair connected from the last contact point pair BmH and BmL of the boost network works. From the third voltage 73 above 2.5 V on, the gain output of the variable gain amplifier is the maximum value. The continuous variable control voltage is used to control the transconductance units and the connected resistor networks to output gain control signals of the VGA to the amplifying networks, and then a continuous variable gain is obtained.

FIG. 8 is a schematic diagram of a relationship between an NF and a control voltage of a continuous variable gain amplifier according to the fifth embodiment of the present invention.

As shown in FIG. 8, the horizontal axis represents the control voltage, and the vertical axis represents the NF of the continuous variable gain amplifier. As is seen from FIG. 8, when the voltage of the input signal increases from the first voltage 71 to the second voltage 72, that is, when the attenuation gradually increases from the maximum attenuation to 0 during the attenuation status of the continuous variable gain amplifier, the NF dB is improved with the increase of the gain dB during the attenuation status. When the voltage increases from the second voltage 72 to the third voltage 73, that is, when the gain increases from 0 to the maximum gain during the gain status of the continuous variable gain amplifier, the NF remains almost unchanged with the increase of the gain dB during the gain status. This further verifies that, by using the continuous variable gain amplifier of the embodiments of the present invention, the NF dB deteriorates with the attenuation of the gain dB during the attenuation status, while, during the gain status, the NF remains almost unchanged with the decrease of the gain dB.

Persons of ordinary skill in the art may be aware that, in combination with the examples described in the embodiments disclosed in this specification, units and algorithm steps may be implemented by electronic hardware, or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to the corresponding process in the foregoing method embodiments, and the details will not be described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present invention essentially, or the part contributing to the prior art, or a part of the technical solutions may be implemented in a form of a software product. The computer software product is stored in a storage medium, and includes several instructions for instructing a computer device (which may be a personal computer, a server, or a network device) to perform all or a part of the steps of the methods described in the embodiments of the present invention. The foregoing storage medium includes: any medium that can store program codes, such as a USB flash disk, a removable hard disk, a read-only memory (ROM, Read-Only Memory), a random access memory (RAM, Random Access Memory), a magnetic disk, or an optical disk.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A continuous variable gain amplifier, comprising an attenuator network, a boost network, a first amplifying network, and a second amplifying network, wherein:
    the attenuator network consists of resistors and is configured to adjust attenuation of the continuous variable gain amplifier;
    the boost network consists of resistors and is configured to adjust a gain of the continuous variable gain amplifier; and the attenuator network generates first differential output signals according to an input signal and sends the first differential output signals to the first amplifying network and the second amplifying network;
    the first amplifying network receives a first output of the first differential output signals sent by the attenuator network, and generates a first final output signal according to an externally input control voltage;
    the second amplifying network receives a second output of the first differential output signals sent by the attenuator network, and generates a second final output signal according to an externally input control voltage;
    the boost network receives the first final output signal output by the first amplifying network and the second final output signal output by the second amplifying network, generates second differential output signals, and sends a first output and a second output of the second differential output signals to the first amplifying network and the second amplifying network, respectively, wherein the first output and the second output of the second differential output signals are used by the first amplifying network and the second amplifying network to generate the first final output signal and the second final output signal, respectively; and
    during a gain status of the continuous variable gain amplifier, the attenuator network stops working, and the gain of the continuous variable gain amplifier is adjusted by the boost network, and during an attenuation status of the continuous variable gain amplifier, the boost network stops working, and the gain is adjusted by the attenuator network.

2. The continuous variable gain amplifier according to claim 1, wherein:
    the attenuator network comprises a first series of contact points and a second series of contact points in symmetry, configured to respond to the input signal, and generate the first output and the second output of a series of the first differential output signals at contact point pairs corresponding to the first series of contact points and the second series of contact points, respectively;
    the boost network comprises a third series of contact points and a fourth series of contact points in symmetry, configured to respond to the first final output signal and the second final output signal, respectively, and generate the first output and the second output of a series of the second differential output signals at contact point pairs corresponding to the third series of contact points and the fourth series of contact points, respectively;
    the first amplifying network comprises a first part of transconductance units and a second part of transconductance units with a joint output, configured to generate a first output signal, wherein each first input terminal of the first part of transconductance units is correspondingly connected to one of the first series of contact points of the attenuator network, second input terminals of the first part of transconductance units are connected to a contact point B1H of the third series of contact points of the boost network, all first input terminals of the second part of transconductance units are connected to a contact point A1H of the first series of contact points of the attenuator network, and each second input terminal of the second part of transconductance units is correspondingly connected to one of the third series of contact points of the boost network; and
    the second amplifying network comprises a third part of transconductance units and a fourth part of transconductance units with a joint output, configured to generate a second output signal, wherein each first input terminal of the third part of transconductance units is correspondingly connected to one of the second series of contact points of the attenuator network, all second input terminals of the third part of transconductance units are connected to a contact point B1L of the fourth series of contact points of the boost network, all first input terminals of the fourth part of transconductance units are connected to a contact point A1L of the second series of contact points of the attenuator network, and each second input terminal of the fourth part of transconductance units is correspondingly connected to one of the fourth series of contact points of the boost network.

3. The continuous variable gain amplifier according to claim 2, wherein:
    the first amplifying network further comprises a first amplifying circuit, wherein the first amplifying circuit is connected to the first part of transconductance units and the second part of transconductance units, and responds to the first output signal to generate the first final output signal and output the first final output signal via a first final output terminal, wherein the first final output terminal is connected to the contact point B1H of the third series of contact points of the boost network; and
    the second amplifying network further comprises a second amplifying circuit, wherein the second amplifying circuit is connected to the third part of transconductance units and the fourth part of transconductance units, and responds to the second output signal to generate the second final output signal and output the second final output signal via a second final output terminal, wherein the second final output terminal is connected to the contact point B1L of the fourth series of contact points of the boost network.

4. The continuous variable gain amplifier according to claim 3, wherein:
the boost network responds to the first final output signal and the second final output signal to generate the first output and the second output of the second differential output signals, and sends the generated first output and second output of the second differential output signals to a second input terminal, connected to the boost network, of the second part of transconductance units and a second input terminal, connected to the boost network, of the fourth part of transconductance units, respectively.

5. The continuous variable gain amplifier according to claim 2, wherein:
the first amplifying circuit or the second amplifying circuit comprises a two-stage amplifying circuit, wherein a first stage of the first amplifying circuit receives the first output signal, and a first stage of the second amplifying circuit receives the second output signal.

6. The continuous variable gain amplifier according to claim 2, wherein:
the contact point A1H is the first of the first series of contact points, the contact point A1L is the first of the second series of contact points, and the contact point A1H and the contact point A1L form a first contact point pair of the attenuator network, and when working states of transconductance unit pairs connected from the last to the first of the contact point pairs of the attenuator network change successively, the attenuation of the continuous variable gain amplifier during the attenuation status gradually decreases from maximum attenuation to zero; and
the contact point B1H is the first of the third series of contact points, the contact point B1L is the first of the fourth series of contact points, and the contact point B1H and the contact point B1L form a first contact point pair of the boost network, and when working states of transconductance unit pairs connected from the first to the last of the contact point pairs of the boost network change successively, the gain of the continuous variable gain amplifier during the gain status gradually increases from zero to a maximum gain.

7. The continuous variable gain amplifier according to claim 2, wherein:
first output terminals of the first part of transconductance units are connected to second output terminals of the second part of transconductance units, and second output terminals of the first part of transconductance units are connected to first output terminals of the second part of transconductance units, so as to jointly output the first output signal; and
first output terminals of the third part of transconductance units are connected to second output terminals of the fourth part of transconductance units, and second output terminals of the third part of transconductance units are connected to first output terminals of the fourth part of transconductance units, so as to jointly output the second output signal.

8. The continuous variable gain amplifier according to claim 2, wherein:
the input signal is a pair of differential signals connected to the contact point pairs of the attenuator network.

9. The continuous variable gain amplifier according to claim 2, wherein:
each transconductance unit comprises a pair of differential triodes controlled by an inserted current source, and a working state of the transconductance unit is determined by controlling a bias current of the inserted current source.

10. The continuous variable gain amplifier according to claim 2, wherein:
an end of the attenuator network and an end of the boost network are connected to a common-mode voltage.

* * * * *